United States Patent [19]
Hayakawa et al.

[11] Patent Number: 4,884,026
[45] Date of Patent: Nov. 28, 1989

[54] ELECTRICAL CHARACTERISTIC MEASURING APPARATUS

[75] Inventors: Yuji Hayakawa; Takuo Uchida, both of Kofu, Japan

[73] Assignee: Tokyo Electron Limited, Tokyo, Japan

[21] Appl. No.: 208,666

[22] Filed: Jun. 20, 1988

[30] Foreign Application Priority Data

Jun. 24, 1987 [JP] Japan .................. 62-157430

[51] Int. Cl.⁴ .................. G01R 31/26; G01R 1/06
[52] U.S. Cl. .......................... 324/158 F; 324/73 PC
[58] Field of Search .......... 324/158 F, 158 P, 73 PC, 324/72.5; 361/234

[56] References Cited

U.S. PATENT DOCUMENTS

| 4,520,421 | 5/1985 | Sakitani et al. | 361/234 X |
| 4,567,432 | 1/1986 | Buol et al. | 324/158 F X |
| 4,590,422 | 5/1986 | Milligan | 324/158 P X |
| 4,692,836 | 9/1987 | Suzuki | 361/234 X |

FOREIGN PATENT DOCUMENTS 57-148356  9/1982  Japan .
58-220438 12/1983  Japan .

Primary Examiner—Reinhard.J. Eisenzopf
Assistant Examiner—Vinh P. Nguyen
Attorney, Agent, or Firm—Oblon, Spivak, McClelland, Maier & Neustadt

[57] ABSTRACT

An electrical characteristic measuring apparatus including, a table for an object to be measured, wherein the table is formed of an insulating material. The generation of an eddy current by an electromagnetic induction effect due to noise can be prevented from occurring in the table. Therefore, the electrical characteristics of the object to be measured can be measured using a very small current with high accuracy. Further, since the insulating resistance of the table is high, electrical discharging can be prevented from occurring between the object to be measured and a ground portion when measuring with a large current. As a result, electrical characteristics can be measured with high accuracy using a large current which is 50 times or more that of a current used in a conventional apparatus.

6 Claims, 4 Drawing Sheets

ELECTRICAL CHARACTERISTIC MEASURING APPARATUS

BACKGROUND OF THE INVENTION

1. Field of the Invention

The present invention relates to an electrical characteristic measuring apparatus for measuring electrical characteristics of a semiconductor chip or the like.

2. Description of the Related Art

For example, for a semiconductor wafer on which a large number of semiconductor chips are formed, electrical characteristics of semiconductor chips are measured in an inspection step. Good and defective semiconductor wafers are distinguished on the basis of the measurement results. An electrical characteristic measuring apparatus having an arrangement shown in, e.g., FIG. 1 is conventionally used as a semiconductor wafer prober. Reference numeral 1 denotes a semiconductor wafer as an object to be measured. Hundreds of semiconductor chips are formed regularly on semiconductor wafer 1. Semiconductor wafer 1 is placed on wafer table 2. Table 2 has a two-layered structure of ceramic base 2b and aluminum base 2a. Probe card 3 is arranged above table 2 to oppose semiconductor wafer 1. Probes 4 project from probe card 3. The electrical characteristics of each semiconductor chip are measured by abutting probes 4 against pads (electrodes formed in a chip) of a predetermined semiconductor chip. More specifically, probes 4 are electrically connected to the corresponding semiconductor chip. A predetermined detective current is flowed from probes 4 connected with a tester to the semiconductor chip. The electrical characteristics of the semiconductor chip are checked based on predetermined semiconductor electrical characteristics corresponding to the detective current measured from the chip. In this case, table 2 is electrically shielded from external noise by shield plate 5 mounted on the lower surface of ceramic base 2b. More specifically, shield plate 5 is grounded through cable 6, so that shield plate 5 exhibits a shielding effect. Shield plate 5 is formed of a conductive material.

Good and defective semiconductor chips are distinguished based on the above mentioned measurement results. Finally, a good or defective semiconductor wafer is determined.

However, in the above-mentioned electrical characteristic measuring apparatus, table 2 is partially formed by aluminum base 2a. Aluminum is a conductive material. For this reason, noise from devices such as a motor incorporated in the electrical characteristic measuring apparatus causes an eddy current to be generated in aluminum base 2a due to an electromagnetic induction effect. A potential of the rear surface of semiconductor wafer 1 cannot become 0 V due to the influence of the eddy current. As a result, measurement errors of electrical characteristics of the semiconductor chips occur.

When semiconductor chips constituting an object to be measured are, e.g., power transistors, table 2 is arranged as follows.

More specifically, as shown in FIG. 2, circular voltage measuring electrode 7 made of gold plating is formed at, e.g., the central portion of the surface of aluminum base 2b. Annular voltage application electrode 8 made of, e.g., gold plating, is formed around electrode 7. Electrodes 7 and 8 are formed at a predetermined interval. With this interval, electrodes 7 and 8 are electrically insulated from each other.

In another table shown in FIG. 3, semi-circular voltage measuring electrode 9 and voltage application electrode 10 are formed on the surface of aluminum base 2b at a predetermined interval so as to be electrically insulated from each other.

In the electrical characteristic measuring apparatus with the arrangement shown in FIG. 2 or 3, a good or defective semiconductor is determined as follows.

More specifically, a semiconductor wafer on which semiconductor chips (e.g., power transistors) are formed is placed on aluminum base 2b. A predetermined voltage is applied from voltage application electrode 8 or 10 to collector electrodes formed on the rear surface of the semiconductor wafer. Then, probes 4 are brought into contact with emitter and base electrodes formed on the front surface of the semiconductor wafer. A voltage applied from voltage application electrode 8 or 10 is measured by voltage measuring electrode 7 or 9. The semiconductor chips are checked based on the measurement values. As a result, a good or defective semiconductor wafer is determined.

However, distances to electrodes 8 (or 10) and 7 (or 9) differ in accordance with the positions of semi-conductor chips formed on the semiconductor wafer. In addition, each collector electrode formed on the rear surface of the semiconductor wafer has a predetermined electrical resistance. Therefore, a voltage drop caused by a difference in distances between the semiconductor chips and electrodes 8 (or 10) and 7 (or 9) is generated during measurement of electrical characteristics. As a result, measurement results vary in accordance with the positions of the semiconductor chips on the semiconductor wafer.

SUMMARY OF THE INVENTION

It is an object of the present invention to provide an electrical characteristic measuring apparatus which can prevent an eddy current generated in a wafer table, and can accurately measure electrical characteristics of an object to be measured.

It is another object of the present invention to provide an electrical characteristic measuring apparatus which can accurately measure electrical characteristics regardless of the positions of objects to be measured.

According to the present invention, there is provided an electrical characteristic measuring apparatus comprising:

a table formed of an insulating material;
a conductor portion arranged on the table;
electrical characteristic detecting means arranged above the conductor portion to oppose an object to be measured placed on the conductor portion;
a support table, formed of an insulating member, for supporting the table: and
drive means for moving the support table in back-and-forth, right-and-left, and up-and-down directions.

In the electrical characteristic measuring apparatus of the present invention, a wafer table is formed of an insulating member. For this reason, an eddy current can be prevented from being generated in the table by an electromagnetic induction effect due to noise during measurement. As a result, electrical characteristics of an object to be measured can be accurately measured by a very small current on the level of 1 fA ($1 \times 10^{-15}$ A).

Since the table has a high insulating resistance, electrical discharging can be prevented from being generated between an object to be measured and a ground portion under the table during measurement using a large current. As a result, electrical characteristics can be accurately measured by a large current about 50 times that in a conventional apparatus.

Voltage application and measuring electrodes which are separated by an elongated insulating region may be formed on a conductor portion of the electrical characteristic measuring apparatus of the present invention.

With this arrangement, the voltage application and measuring electrodes can always be arranged under an object to be measured. As a result, the measurement value can be prevented from being changed due to a voltage drop across an electrode portion below the object to be measured. Thus, electrical characteristics of the object can be accurately measured.

DETAILED DESCRIPTION OF THE PREFERRED EMBODIMENT

An embodiment of the present invention will be described with reference to the accompanying drawings.

Figure 1:
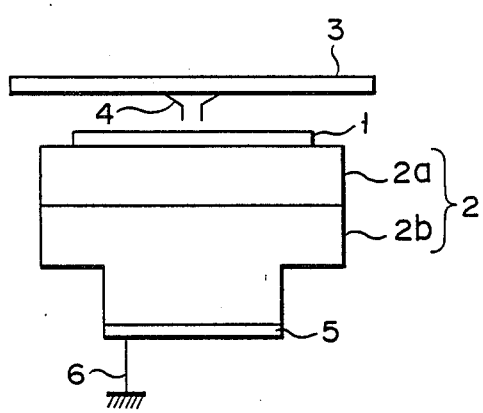
FIG. 1 is a view for explaining a schematic arrangement of a conventional electrical characteristic measuring apparatus.
Figure 2:
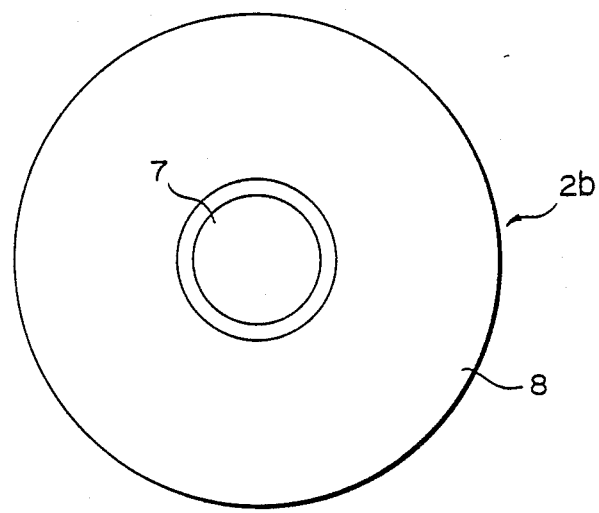
FIG. 2 is a plan view showing a surface of a wafer table of the conventional electrical characteristic measuring apparatus.
Figure 3:
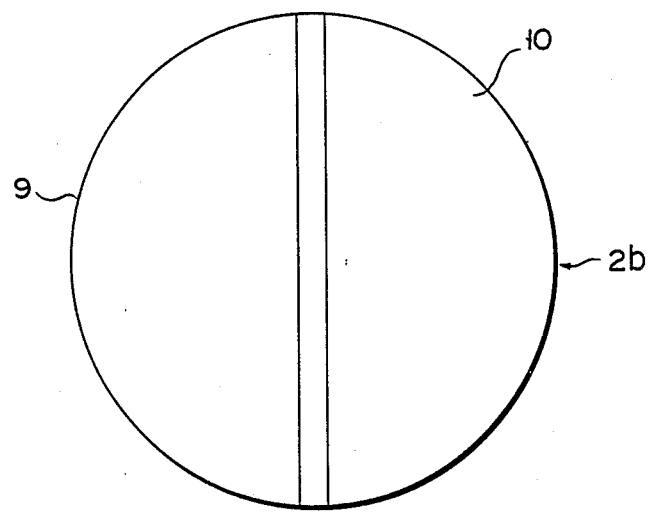
FIG. 3 is a plan view showing a surface of another wafer table of the conventional electrical characteristic measuring apparatus.
Figure 4:
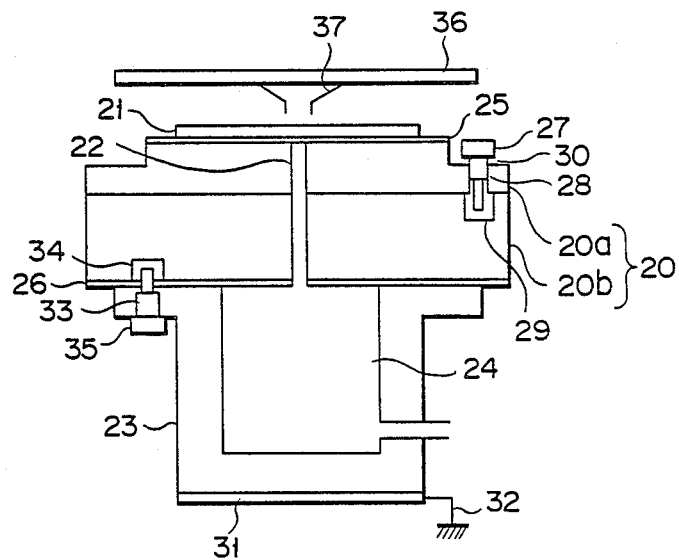
FIG. 4 is a view for explaining a schematic arrangement of an electrical characteristic measuring apparatus according to an embodiment of the present invention.

FIG. 4 is a view for explaining a schematic arrangement of an electrical characteristic measuring apparatus according to an embodiment of the present invention. In FIG. 4, reference numeral 20 denotes a wafer table. An object to be measured such as semiconductor wafer 21 is placed on table 20. A vacuum hole 22 is formed in table 20 to extend from the upper surface whereon a wafer is placed to the rear surface of the bottom portion.

Table 20 is mounted on support table 23. Vacuum hole 22 communicates with hollow portion 24 formed in support table 23. Hollow portion 24 is connected to a suction device such as a vacuum pump (not shown) through suction pipe 25. Semiconductor wafer 21 placed on table 20 is chucked on table 20 by a chucking mechanism constituted by vacuum hole 22 or the like.

Table 20 has a two-layered structure of upper and lower portions 20a and 20b. Upper portion 20a is formed of an insulating material such as quartz. The surface of upper portion 20a serves to have a wafer placed thereon. The surface of upper portion 20a is formed of conductor portion 25 of a conductive thin plate having a low contact resistance. Conductive portion 25 can be formed by a method such as, e.g., plating, depositing or sputtering gold. Lower portion 20b is formed of an insulating material such as a ceramic. Guard electrode 26 is formed on the lower surface of lower portion 20b. Guard electrode 26 can provide an electrical shield effect to table 20. Guard electrode 26 is formed of, e.g., silver palladium.

Upper portion 20a is fixed to lower portion 20b by a plurality of screws 27. Since threads cannot be formed in quartz upper portion 20a, vertical through holes 28 are formed at predetermined portions (e.g., 8 portions) on the peripheral portion of upper portion 20a. Female threaded bushings 29 made of a metal are embedded in portions of lower portion 20b which correspond to through holes 28. Each screw 27 is inserted in the corresponding female threaded bushing 29 through an elastic member consisting of O-ring 30 made of, e.g., rubber. Screws 27 are screwed in corresponding bushings 29, thus obtaining table 20 integrally fixed to upper and lower portions 20a and 20b. Rubber O-rings 30 serve to prevent damage to quartz upper portion 20a when screws 27 are tightly screwed in bushings 29.

Support table 23 is formed of, e.g., a ceramic. Support table 23 may be moved upward and downward (Z), from right to left (X), and backward and forward (Y) by a drive motor (not shown).

Shield member 31 is adhered to the bottom surface of support table 23. Shield member 31 is formed of a material such as gold, silver palladium, or the like, having a high conductivity. Shield member 31 is connected and grounded to an apparatus housing (not shown) through, e.g., cable 32. Shield member 31 is arranged to prevent a measurement of electrical characteristics of a semiconductor wafer as an object to be measured from being adversely affected by noise cause by, e.g., a drive motor.

Support table 23 and table 20 are fixed as follows. More specifically, vertical through holes 33 are formed at predetermined portions (e.g., four portions) on the peripheral portion of support table 23. Female threaded bushings 34 are embedded in portions of table 20 which correspond to these through holes 33 to extend through guard electrode 26. Screws 35 are screwed into bushings 34 from below, via through holes 33. Thus, tables 23 and 20 are integrally fixed to one another.

Probe card 36 for measuring electrical characteristics of semiconductor chips formed on semiconductor wafer 21 is provided above table 20. Probes 37 to be brought into contact with predetermined pads of the semiconductor chips project from probe card 36.

The electrical characteristic measuring apparatus with the above arrangement measures electrical characteristics of semiconductor chips formed on semiconductor wafer 21 as follows.

First, semiconductor wafer 21 is conveyed to a predetermined position on table 20 by, e.g., a hand arm of a convey mechanism (not shown).

Table 20 is then moved together with support table 23 in the X and Y directions by the drive motor (not shown), so that a given semiconductor chip to be measured is located immediately below probes 37 of probe card 36. In a state wherein the semiconductor chip to be measured is located immediately below probes 37, table 20 is moved upward (in the Z direction) toward probe card 36. With this operation, predetermined portions of the semiconductor chip are brought into electrical contact with probes 37.

Table 20 is moved further upward to be 10 to 200 μm from the above contact state to perform over-driving. In this state the electrical characteristics of the semiconductor chip can be measured.

Figure 5:
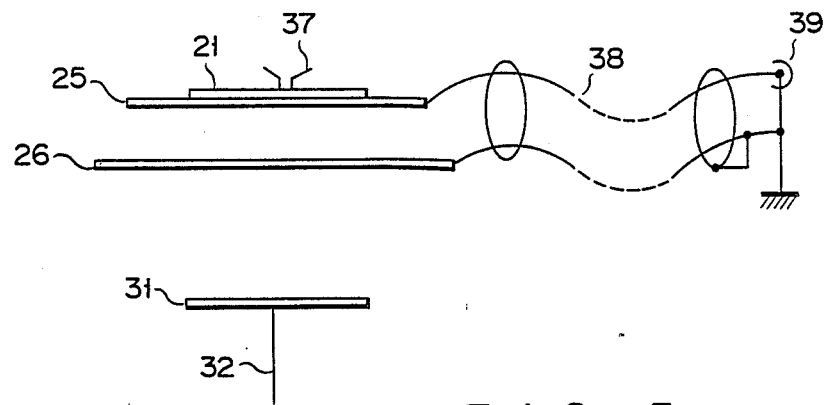
FIG. 5 is a view for explaining a state wherein a measuring device is connected to the apparatus shown in FIG. 4.

As shown in FIG. 5, a core line of coaxial cable 38 is connected to conductor portion 25 which contacts the rear surface of semiconductor wafer 21. The other end of coaxial cable 38 is connected to measuring device 39. A shield portion of coaxial cable 38 is connected to guard electrode 26. That is, the rear surface of the semiconductor wafer is connected to the ground portion of measuring device 39 sequentially through conductor portion 25 and coaxial cable 38. Note that support table 23 is connected to the ground portion of the apparatus housing through shield member 31, as described above.

In this state, a measured small current is flowed from probes 37 or conductor portion 25 to the predetermined portions of the semiconductor chip. A small current of about 1 fA ($=1\times10^{-15}$ A) is used.

The electrical characteristic of the semiconductor chip is measured in accordance with a change in the small current. In this case, guard electrode 26 is subjected to the double electrical shielding effect without being affected by shield member 31. This is because guard electrode 26 is connected to the ground portion of measuring device 39, and shield member 31 is connected to the grounded apparatus housing. With this double shielding structure, a small current of about 1 fA can be used for measuring electrical characteristics without being affected by noise.

Figure 6A:
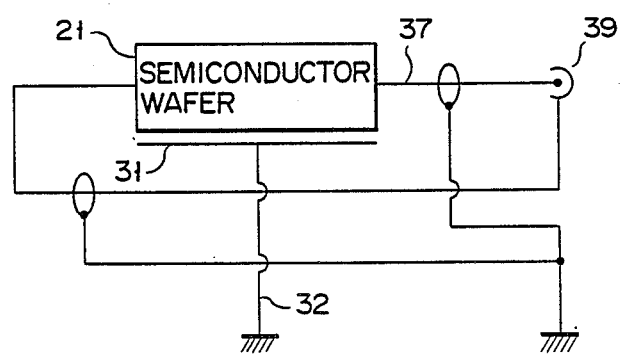
FIG. 6A is a view for explaining a state wherein a measurement device and a semiconductor wafer are grounded-connected.
Figure 6B:
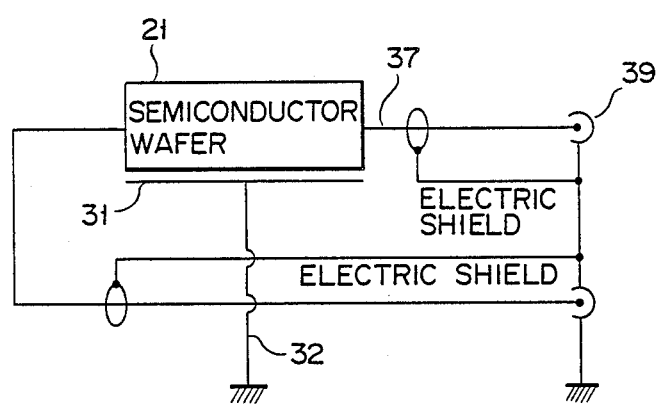
FIG. 6B is a view for explaining a state wherein a measurement device and a semiconductor wafer are floating-connected.

Electrical connection with semiconductor wafer 21 through measuring device 39 and conductor portion 25 can be achieved by a so-called earth connection such as grounded-connection which can eliminate the influence of an input internal resistance of measuring device 39, as shown in FIG. 6A or a floating-connection, as shown in FIG. 6B. When measuring device 39 and semiconductor wafer 21 are connected in this manner, measurement errors can be reduced.

Thus, whether or not the semiconductor chip has predetermined electrical characteristics is determined by measuring the current in accordance with a change in the small current. After electrical characteristics of one semiconductor chip are measured, table 20 is moved downward together with support table 23. Semiconductor wafer 21 is moved together with table 20 so that the next semiconductor chip to be measured is located immediately below probes 37, as described above. Then, probes 37 are brought into contact with the predetermined portions of the semiconductor chip to be measured next. Whether or not this semiconductor chip has predetermined electrical characteristics is determined by measuring the current in accordance with a change in the small current as described above. The above operation is repeated to measure the electrical characteristics of all the semiconductor chips formed on semiconductor wafer 21. Any defect of semiconductor wafer 21 can be determined based on the measurement data.

Since table 20 is constituted by quartz upper portion 20a and ceramic lower portion 20b and has a high electrical insulating resistance, the interior of table 20 can be prevented from being affected by noise from a motor or an external circuit during measurement of the electrical characteristics of semiconductor chips using a small current. As a result, an eddy current can be prevented from being generated due to noise, and the measurement accuracy of electrical characteristics of semiconductor chips can be improved.

When the electrical characteristics of semiconductor chips are measured using a large current, a current of 5 A or a voltage of 2,500 V is applied from probes 37 to the corresponding semiconductor chip.

In this case, since table 20 constitutes an insulating member having a high electrical insulating resistance, extremely high breakdown voltage characteristics are exhibited. As a result, when shield member 31 and semiconductor wafer 21 are applied with a high voltage (2,500 V), electrical discharging can be prevented from occurring therebetween. The electrical characteristics of semiconductor chips can be measured with extremely high accuracy.

Since table 20 has a high insulating resistance, generation of an eddy current due to an electromagnetic induction effect of noise can be prevented. The electrical characteristics of an object to be measured such as semiconductor wafer 21 can be measured with high accuracy using a small current of about 1 fA ($=1\times10^{-15}$ A). In the conventional apparatus, a small current as high as 1 pA ($=1\times10^{-12}$ A) can only be used.

Since the insulating resistance of table 20 is high, electrical discharging between the object to be measured and the ground portion under table 20 can be prevented. As a result, measurement of electrical characteristics using a large current 50 times or more that in the conventional apparatus can be performed with high accuracy.

Note that if table 20 has a single-layer structure of a quartz base, substantially the same effect as described above can be obtained.

Figure 7:
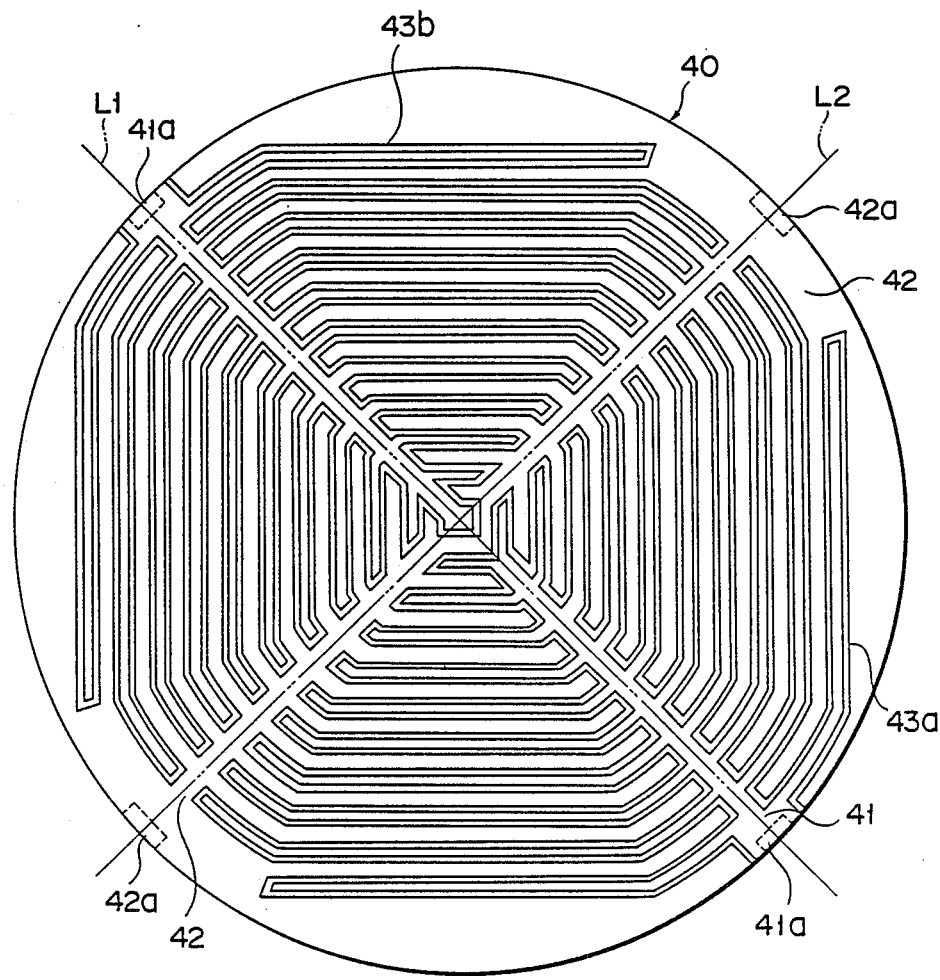
FIG. 7 is a plan view showing a conductor portion comprising voltage measuring and application electrodes each having a predetermined shape.

When semiconductor chips, e.g., power transistors are formed on semiconductor wafer 21 as an object to be measured, conductor portion 25 can have a structure as shown in FIG. 7, so that electrical characteristics of the object can be measured with high accuracy. Note that the structure except for conductor portion 25 can employ that shown in FIG. 4 described above.

Conductor portion 40 shown in FIG. 7 is formed of gold or the like. Conductor portion 40 comprises voltage measuring and application electrodes 41 and 42.

Voltage measuring electrode 41 has two measuring electrode connection terminals 41a at two end portions of imaginary line L1 passing through substantially the center of table 20.

Voltage application electrode 42 has two application electrode connection terminals 42a at two end portions of imaginary line L2 which passes through substantially the center of table 20 and is perpendicular to line L1.

Voltage measuring and application electrodes 41 and 42 are formed by dividing the surface of conductor portion 40 by elongated zig-zag insulating regions 43a and 43b. More specifically, elongated zig-zag insulating region 43a is formed on semi-circular portion of conductor portion 40 divided by imaginary line L2 so as to have another imaginary line L1 as an axis of symmetry. A portion of conductor portion 40 inside insulating region 43a forms half voltage measuring electrode 41. Another portion of conductor portion 40 outside insulating region 43a forms half voltage application electrode 42. Furthermore, similar insulating region 43b is formed on the remaining semi-circular portion of conductor portion 40 to have imaginary line L2 as an axis of symmetry. The remaining portion of voltage measuring electrode 41 is formed a portion of conductor portion 40 inside insulating region 43b. The remaining portion of voltage application electrode 42 is formed on another portion of conductor portion 40 outside insulating region 43b.

That is, when the entire conductor portion 40 is viewed from one terminal 41a toward the other terminal 41a, voltage measuring and application electrodes 41 and 42 are alternately formed while being electrically insulated from each other by insulating regions 43a and 43b.

Note that although not shown, members corresponding to vacuum holes 22 shown in FIG. 4 are formed in conductor portion 40 in the form of a large number of grooves or small holes.

Semiconductor wafer 21 on which a large number of semiconductor chips such as power transistors are formed is fixed on conductor portion 40 with the above structure.

A predetermined voltage is then applied from voltage application electrode 42 to the collector electrodes formed on the rear surface of semiconductor wafer 21. This voltage is measured by voltage measuring electrode 41. In this case, electrodes, e.g., emitter and base electrodes, formed on the front surface of semiconductor wafer 21, are brought into contact with probes 37.

In this manner, electrical characteristics of semiconductor chips are measured. The semiconductor wafer is discriminated based on the measurement data.

When the electrical characteristics are measured in this manner, voltage measuring and application electrodes 41 and 42 which are separated by insulating regions 43a and 43b and alternately formed are in contact with the rear surface of semiconductor wafer 21 during measurement.

As a result, the adverse influence of a voltage drop caused by a difference in positions of electrodes on the rear surface of semiconductor wafer can be prevented during measurement of electrical characteristics of semiconductor chips.

In this embodiment, the effect of the previous embodiment can also be provided.

What is claimed is:

1. An electrical characteristic measuring apparatus comprising:
   a table formed of quartz;
   a conductor portion arranged on said table;
   electrical characteristic detecting means arranged above said conductor portion to oppose an object to be measured placed on said conductor portion;
   a support table, formed on an insulating member, for supporting said table; and
   a guard electrode interposed between said table and said support table.

2. An electrical characteristic measuring apparatus, comprising:
   a table having an upper portion formed of quartz and a lower portion formed of a ceramic;
   a conductor portion arranged on said upper portion of said table;
   electrical characteristic detecting means arranged above said conductor portion to oppose an object to be measured placed on said conductor portion;
   a support table, formed of an insulating member, for supporting said table; and
   a guard electrode interposed between said table and said support table.

3. An apparatus according to claim 2, wherein said electrical characteristic detecting means is a probe card comprising probes to be brought into contact with said object to be measured.

4. An apparatus according to claim 2, further comprising means for chucking said object to be measured on said table.

5. An apparatus according to claim 2, wherein said object to be measured is a semiconductor wafer.

6. An electrical characteristic measuring apparatus, comprising:
   a table formed of an insulating material;
   a conductor portion arranged on said table, said conductor portion comprising a voltage application electrode and voltage measuring electrode formed in a zig-zag pattern, and an elongated insulating region being formed substantially concentric with each said voltage application electrode and each said voltage measuring electrode;
   electrical characteristic detecting means arranged above said conductor portion to oppose an object to be measured placed on said conductor portion; and
   a support table, formed of an insulating member, for supporting said table.

* * * * *